United States Patent
Furukawa et al.

(10) Patent No.: US 7,129,138 B1
(45) Date of Patent: Oct. 31, 2006

(54) METHODS OF IMPLEMENTING AND ENHANCED SILICON-ON-INSULATOR (SOI) BOX STRUCTURES

(75) Inventors: Toshiharu Furukawa, Essex Junction, VT (US); Carl John Radens, LaGrangeville, NY (US); William Robert Tonti, Essex Junction, VT (US); Richard Quimby Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/106,004

(22) Filed: Apr. 14, 2005

(51) Int. Cl.
*H01L 21/762* (2006.01)
(52) U.S. Cl. .............. 438/294; 438/295; 438/297; 438/407; 438/528; 438/928; 257/E21.563
(58) Field of Classification Search .............. 438/294, 438/295, 297, 407, 528, 928, FOR. 222; 257/E21.563
See application file for complete search history.

(56) References Cited

U.S. PATENT DOCUMENTS

| | | | | |
|---|---|---|---|---|
| 5,441,899 A | * | 8/1995 | Nakai et al. ............ | 438/766 |
| 5,510,276 A | * | 4/1996 | Diem et al. ............ | 438/53 |
| 5,554,883 A | * | 9/1996 | Kuroi ............ | 257/617 |
| 6,180,487 B1 | * | 1/2001 | Lin ............ | 438/407 |
| 6,429,091 B1 | * | 8/2002 | Chen et al. ............ | 438/423 |
| 2004/0007741 A1 | * | 1/2004 | Matsukawa ............ | 257/347 |
| 2004/0219761 A1 | * | 11/2004 | Fuselier et al. ............ | 438/423 |
| 2004/0235273 A1 | * | 11/2004 | Jang ............ | 438/480 |

* cited by examiner

*Primary Examiner*—George Fourson
(74) *Attorney, Agent, or Firm*—Joan Pennington

(57) ABSTRACT

Enhanced silicon-on-insulator (SOI) buried oxide (BOX) structures and methods are provided for implementing enhanced SOI BOX structures. An oxygen implant step is performed from a backside into a thinned silicon substrate layer. An anneal step forms thick buried oxide (BOX) regions from oxygen implants in the silicon substrate layer. The oxygen implant step forms an isolated region near the oxygen implants. A backside implant step selectively dopes the isolated region for forming a backgate for an SOI device being formed including a selected one of anti-fuse (AF) devices, and SOI transistors including PFET and NFET devices.

11 Claims, 22 Drawing Sheets

METHODS OF IMPLEMENTING AND ENHANCED SILICON-ON-INSULATOR (SOI) BOX STRUCTURES

FIELD OF THE INVENTION

The present invention relates generally to the field of semiconductor manufacturing and, more specifically, to enhanced silicon-on-insulator (SOI) buried oxide (BOX) structures and methods for implementing enhanced SOI BOX structures.

DESCRIPTION OF THE RELATED ART

Silicon-on-insulator (SOI) transistors provide better performance at low operating voltages than do transistors of similar dimensions fabricated in bulk silicon substrates. Superior performance of SOI transistors at low operating voltage is related to the relatively lower junction capacitances obtained on an SOI device as compared to a bulk silicon device of similar dimensions. A buried oxide layer in an SOI device separates active transistor regions from the bulk silicon substrate, reducing junction capacitance.

Various SOI transistor arrangements are known. For example, Wei et al., U.S. patent application Publication No. US 2003/0223258 published Dec. 4, 2003, and assigned to the present assignee, discloses a method comprising forming a gate electrode above an SOI substrate comprised of a bulk substrate, a buried insulation layer and an active layer, the gate electrode having a protective layer formed thereabove, and forming a plurality of dielectric regions in the bulk substrate after the gate electrode is formed, the dielectric regions being self-aligned with respect to the gate electrode, the dielectric regions having a dielectric constant that is less than a dielectric constant of the bulk substrate. In other embodiments, the method comprises forming a gate electrode above an SOI substrate comprised of a bulk substrate, a buried insulation layer and an active layer, the gate electrode having a protective layer formed thereabove, performing at least one oxygen implant process after the gate electrode and the protective layer are formed to introduce oxygen atoms into the bulk substrate to thereby form a plurality of oxygen-doped regions in the bulk substrate, and performing at least one anneal process to convert the oxygen-doped regions to dielectric regions comprised of silicon dioxide in the bulk substrate. In one illustrative embodiment, the device comprises a gate electrode formed above an SOI structure comprised of a bulk substrate, a buried insulation layer, and an active layer, and a plurality of dielectric regions comprised of silicon dioxide formed in the bulk substrate, the dielectric regions being self-aligned with respect to the gate electrode.

While the above disclosed methods and silicon-on-insulator (SOI) structures provide improvements over prior art arrangements, a need exists for enhanced SOI devices and methods for manufacturing thereof. It is desirable to provide new backgate processing techniques and enhanced SOI BOX structures.

SUMMARY OF THE INVENTION

Principal aspects of the present invention are to provide enhanced silicon-on-insulator (SOI) buried oxide (BOX) structures and methods for implementing enhanced SOI BOX structures. Other important aspects of the present invention are to provide such enhanced silicon-on-insulator (SOI) buried oxide (BOX) structures and methods for implementing enhanced SOI BOX structures substantially without negative effect and that overcome many of the disadvantages of prior art arrangements.

In brief, enhanced silicon-on-insulator (SOI) buried oxide (BOX) structures and methods are provided for implementing enhanced SOI BOX structures.

In accordance with one embodiment of the invention, a silicon-on-insulator (SOI) structure is provided including a silicon substrate layer, a thin buried oxide (BOX) layer carried by the silicon substrate layer, an active layer carried by the thin BOX layer, and a pad oxide layer carried by the active layer. The silicon substrate layer is thinned and an oxygen implant step is performed from the backside into the thinned silicon substrate layer. An anneal step forms thick buried oxide (BOX) regions from oxygen implants in the silicon substrate layer.

In accordance with features of one embodiment of the invention, the oxygen implant step forms an isolated region near the oxygen implants. A backside implant step selectively dopes the isolated region for forming a backgate for an SOI device being formed including a selected one of anti-fuse (AF) devices, and SOI transistors including PFET and NFET devices.

In accordance with features of one embodiment of the invention, a gate oxide and a gate electrode are formed over the active region above the backgate. Doping, formation and activation of each respective source/drain region and the gate electrode are provided for the SOI transistor In accordance with features of one embodiment of the invention, an image of the gate electrode is larger than a backgate image, whereby gate alignment problems of the SOI transistor are minimized. A programmable body contact is provided, for example, by applying a first voltage supply potential between the source/drain regions and the backgate and applying a second voltage supply potential between the gate electrode and ground, where the first voltage supply potential is greater than the second voltage supply potential.

In accordance with features of one embodiment of the invention, a doping implant into the active layer above the backgate forms a doped plate region from the active layer. A contact formation on the backgate and doped plate region provides respective anti-fuse (AF) connections. A voltage supply source is connected between the respective anti-fuse (AF) connections in a fuse programming step forming a conduction path between the backgate and doped plate region.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
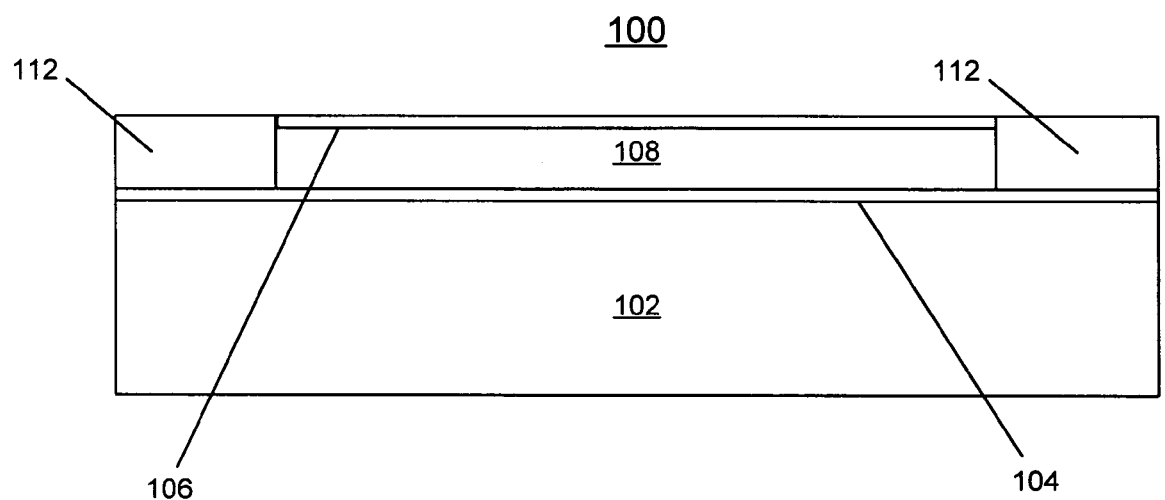
FIGS. 1–3, 4A and 4B are diagrams not to scale illustrating exemplary steps for implementing enhanced SOI BOX structures in accordance with one preferred embodiment.

In accordance with features of preferred embodiments, novel backgate processing methods and backgate structures are provided. The novel backgate processing methods and backgate structures provide preferential Si island strain for both NF and PF device mobility enhancement. Simultaneous thin and thick BOX regions are provided for minimized junction capacitance, and improved backgate coupling. A novel backgate Anti-Fuse structure using a Thin/Thick gate SOI device and another backgate Anti-Fuse (AF) structure of one of preferred embodiment is arranged for providing a programmable body contact.

Referring now to the drawings, FIGS. 1–3, 4A and 4B illustrate exemplary steps for implementing enhanced SOI BOX structures in accordance with one preferred embodiment where preferential Si island strain for both NF and PF device mobility enhancement and simultaneous thin and thick BOX regions are provided for minimized junction capacitance, and improved backgate coupling. A non-self-aligned O+ implant is used to form thick box regions under MOS diffusions, or thick regions in the center of an active island. A bulk silicon substrate is first thinned, and an O+ Implant, selectively masked or unmasked, is introduced from the backside. In the region of the O+ implant, the resultant oxide after anneal is thickened. The thick BOX region may consume the entire remaining bulk Si, or a remaining SI layer may be left. The thin Si layer that remains in the vicinity of the thick oxide can be etched if desired.

Referring initially to FIG. 1, there is shown an exemplary structure generally designated by the reference character 100 for implementing enhanced SOI BOX structures of preferred embodiments. Structure 100 includes a substrate 102, such as a silicon substrate 102, a very thin buried oxide (BOX) layer 104, such as an oxynitride layer, of thickness range 2 nm to 10 nm, a gate insulation layer or gate dielectric 106 of EOT (electrically Equivalent Oxide Thickness) of 0.9 nm to 2 nm, an active layer or silicon layer 108 of thickness range 5 nm to 750 nm, and shallow trench isolation (STI) region 112 formed over the thin BOX layer 104. STI region 112 is continuous around the active device region.

Figure 2:
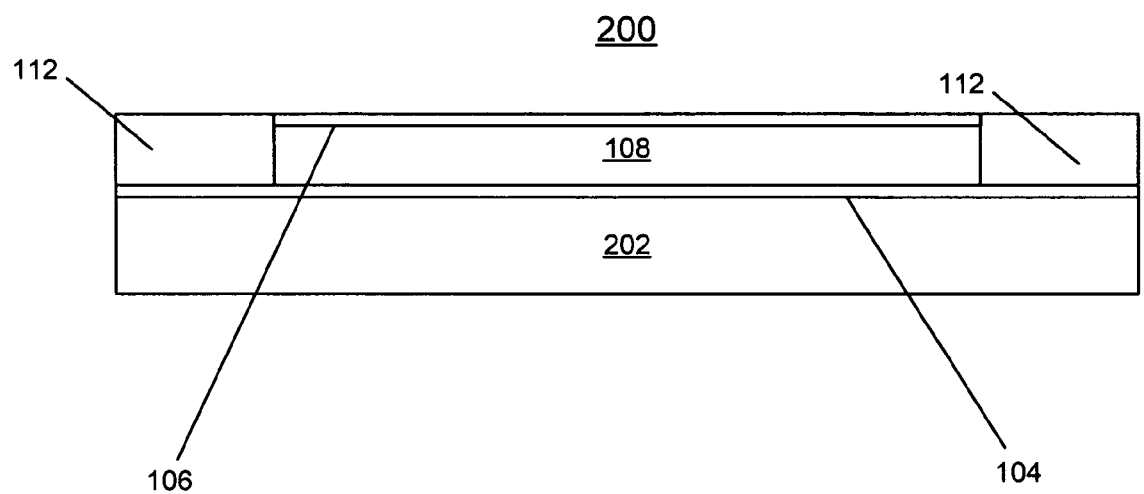

Referring now to FIG. 2, there is shown a next exemplary structure 200 where the silicon substrate 102 is first thinned, providing a thin substrate layer 202. For example, an initial thickness of silicon substrate 102 as generally determined for each process technology is reduced either globally or locally to a thickness of 10 nm to 10,000 nm, preferably 500 nm.

Figure 3:
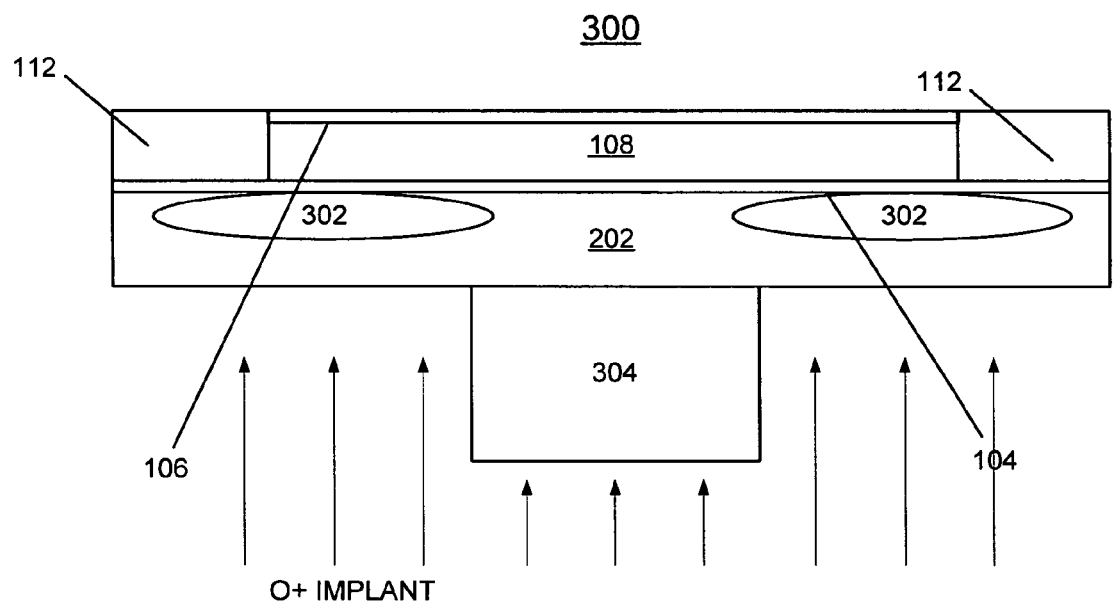

Referring now to FIG. 3, there is shown a next exemplary structure 300 where an oxygen implant step is performed as indicated by arrows O+implant from the backside to provide a pair of respective oxygen implants 302 in the thinned bulk substrate 202 using an optional mask 304. The regions of oxygen implants are located, for example, under regions of active layer 108 that are later used for forming source and drain of the SOI transistor. The oxygen implant step through the thinned substrate layer 202 is provided at a selected dose and energy level for forming respective oxygen implants 302 slightly below or vertically adjacent to layer 108. The oxygen implant step through the backside of thin substrate layer 202 is provided, for example, at an energy level in a range from 20 to 200 KeV using a dose of in the range of $10^{16}$ cm$^{-2}$ to $5 \times 10^{18}$ cm$^{-2}$.

Figure 4A:
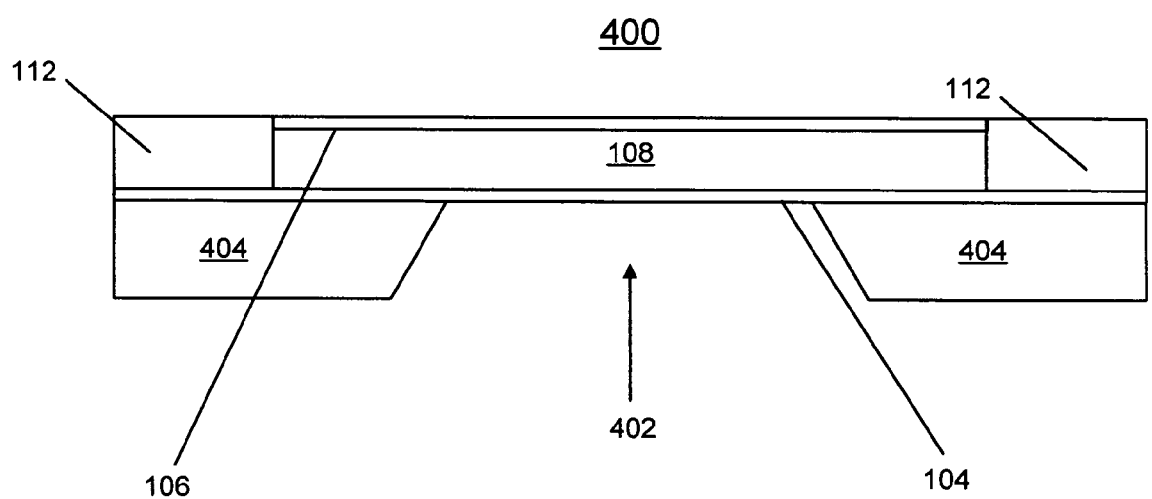

Referring now to FIG. 4A, there is shown a next exemplary structure 400 where all silicon is consumed with a central silicon region selectively removed as indicated by arrow 402 and an anneal process convert the oxygen implants 302 to a respective thick BOX region 404. Alternatively, the central silicon region indicated by arrow 402 can be left in place. The anneal process is performed, for example, at a temperature between 600° C. to 1350° C., preferably in a temperature range between 900° C. and 1100° C., for a period of several minutes to 10 hours in a non-reactive ambient.

Figure 4B:
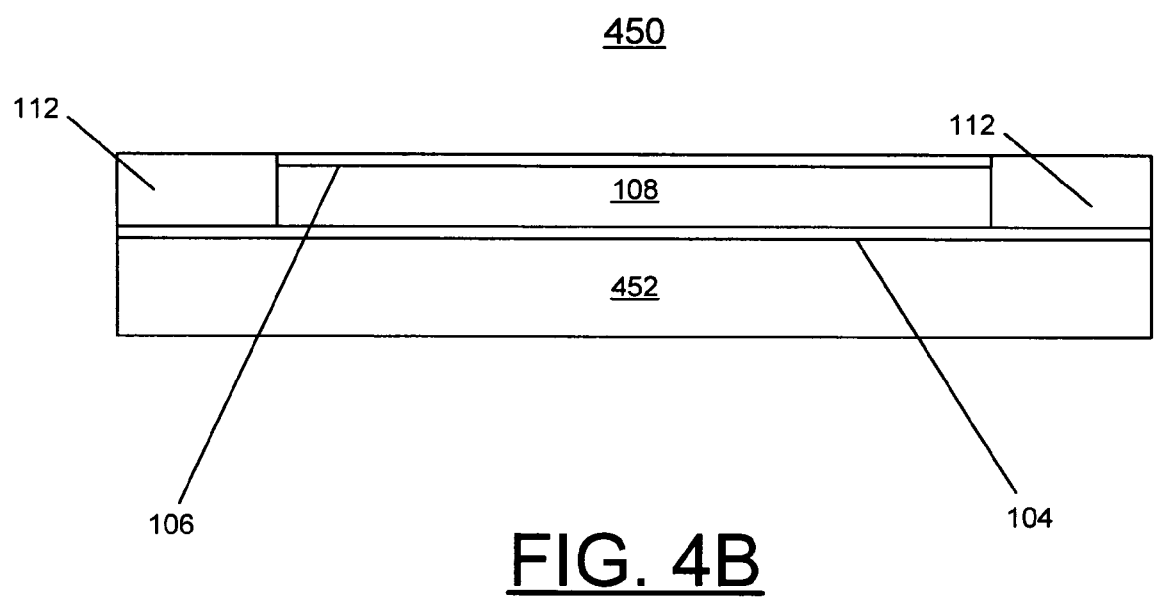

Referring now to FIG. 4B, there is shown another next exemplary structure 450 where a thick BOX region 452 extends across an entire device when the optional mask 304 is not used with the oxygen implant step of FIG. 3. An anneal process forming the thick BOX region 452 is performed, for example, at a temperature between 600° C. to 1350° C., preferably in a temperature range between 900° C. and 1100° C., for a period of several minutes to 10 hours.

Figure 5:
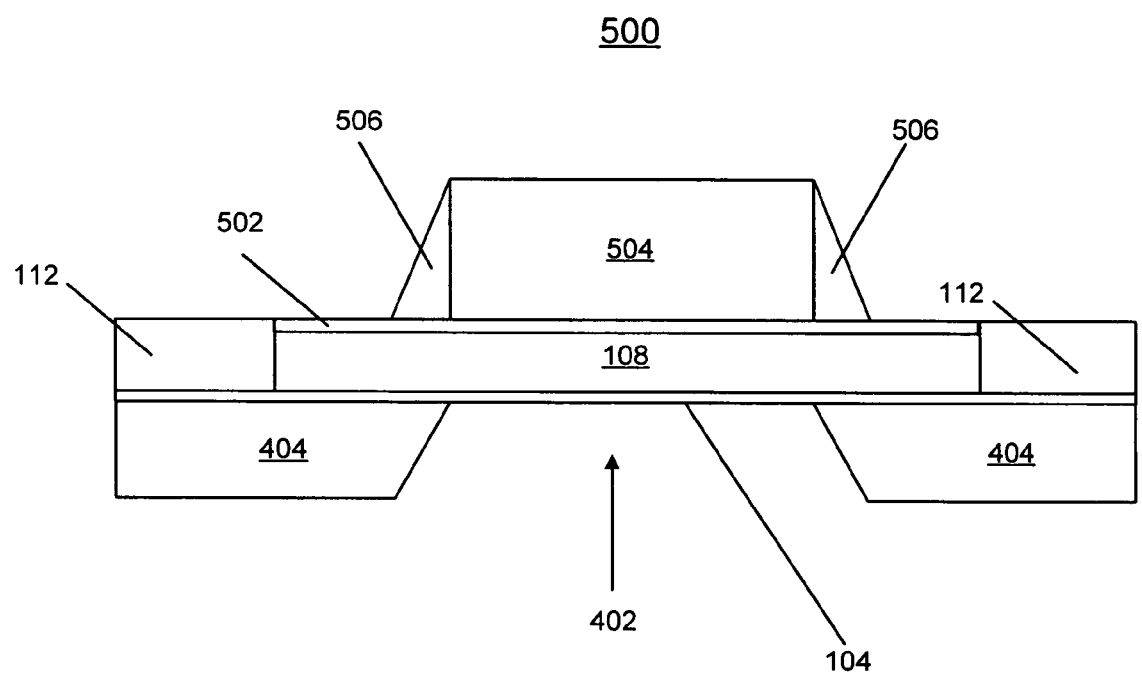
FIG. 5 is a diagram not to scale illustrating further exemplary steps for implementing silicon-on-insulator (SOI) transistor processing on the enhanced SOI BOX structure of FIG. 4A in accordance with one preferred embodiment.

Referring now to FIG. 5, there is shown a next exemplary structure generally designated by the reference character 500 for implementing silicon-on-insulator (SOI) transistor processing on the enhanced SOI BOX structure of FIG. 4A in accordance with one preferred embodiment. The pad oxide layer 106 is stripped and a gate oxide layer 502 is grown. A gate electrode 504 is formed. The gate electrode 504, such as polysilicon or a metal gate electrode 504, has, for example, a thickness range 10 nm to 100 nm. Optionally a pair of spacers 506 is formed on the sidewalls of the gate electrode 504. Also conventional front-end-of-line (FEOL) processing steps can be used to complete a transistor device. These steps can include but are not limited to source/drain implants, extension implants, silicide formation on the gate, source, and drain, and contact formation (not shown).

Figure 6:
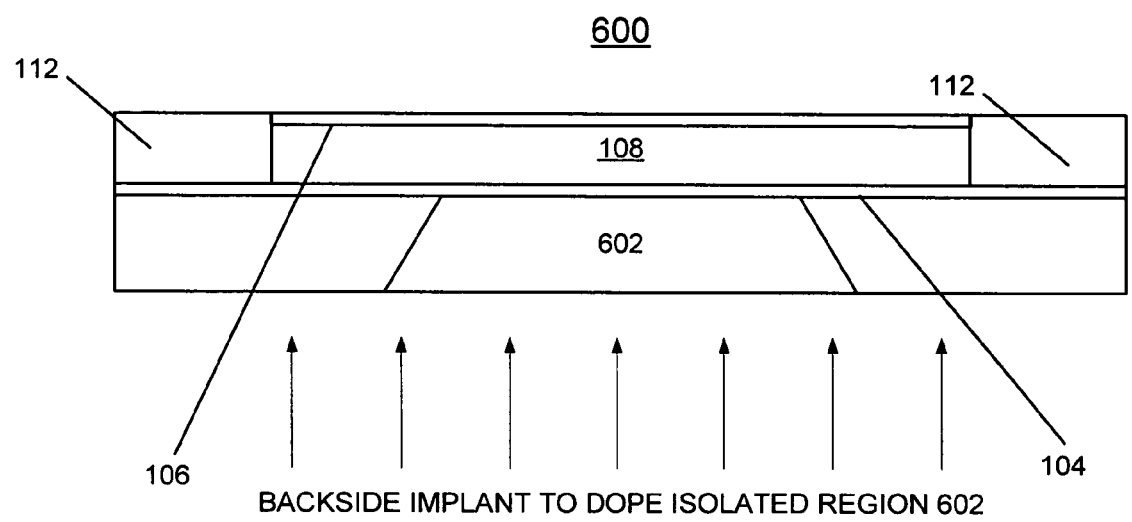
FIG. 6 is a diagram not to scale illustrating further exemplary steps for a backside implant performed to dope an isolated region on the enhanced SOI BOX structure of FIG. 4A for implementing an enhanced SOI BOX structure in accordance with another preferred embodiment.

Referring now to FIG. 6, there is shown a next exemplary structure generally designated by the reference character 600 where a backside implant indicated by arrows is performed to dope an isolated region 602 in the enhanced SOI BOX structure 400 of FIG. 4A for implementing an enhanced SOI BOX structure in accordance with another preferred embodiment.

Figure 7A:
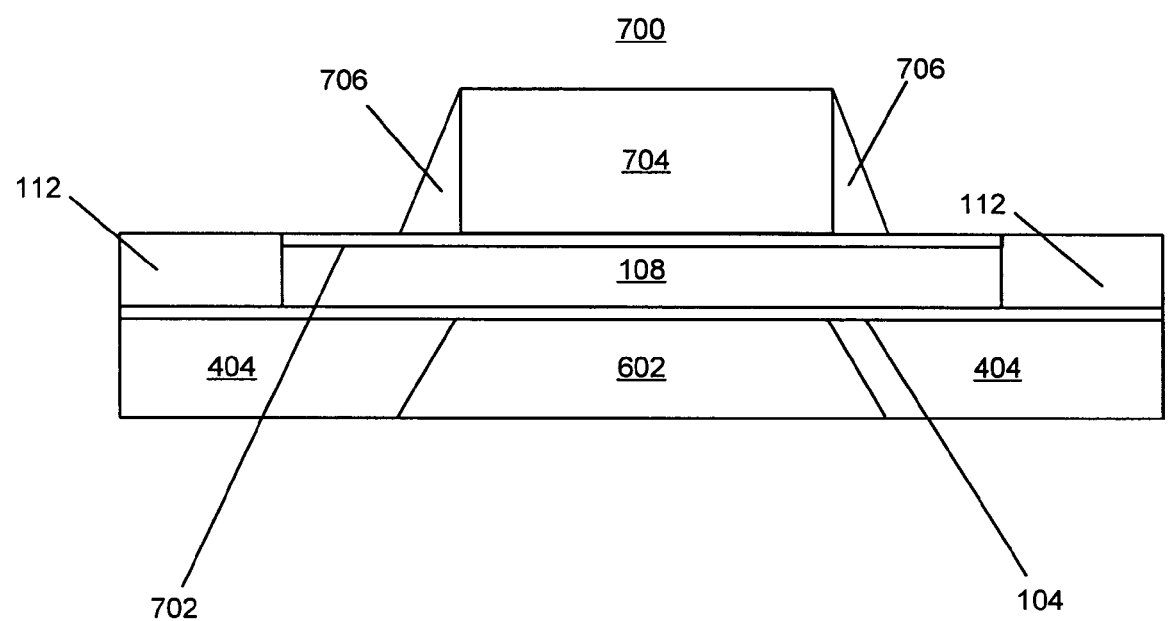
FIG. 7A is a diagram not to scale illustrating further exemplary steps for implementing silicon-on-insulator (SOI) transistor processing on the enhanced SOI BOX structure of FIG. 6 in accordance with another preferred embodiment.

Referring now to FIG. 7A, there is shown a next exemplary structure generally designated by the reference character 700 where further silicon-on-insulator (SOI) transistor processing steps are performed on the enhanced SOI BOX structure 600 of FIG. 6 in accordance with another preferred embodiment. The pad oxide layer 106 is stripped and a gate oxide layer 702 and a gate electrode 704 are formed. The gate electrode 704, such as polysilicon gate electrode has, for example, a thickness range 10 nm to 100 nm. As shown, a pair of spacers 706 optionally is formed on the sidewalls of the gate electrode 704.

Figure 7B:
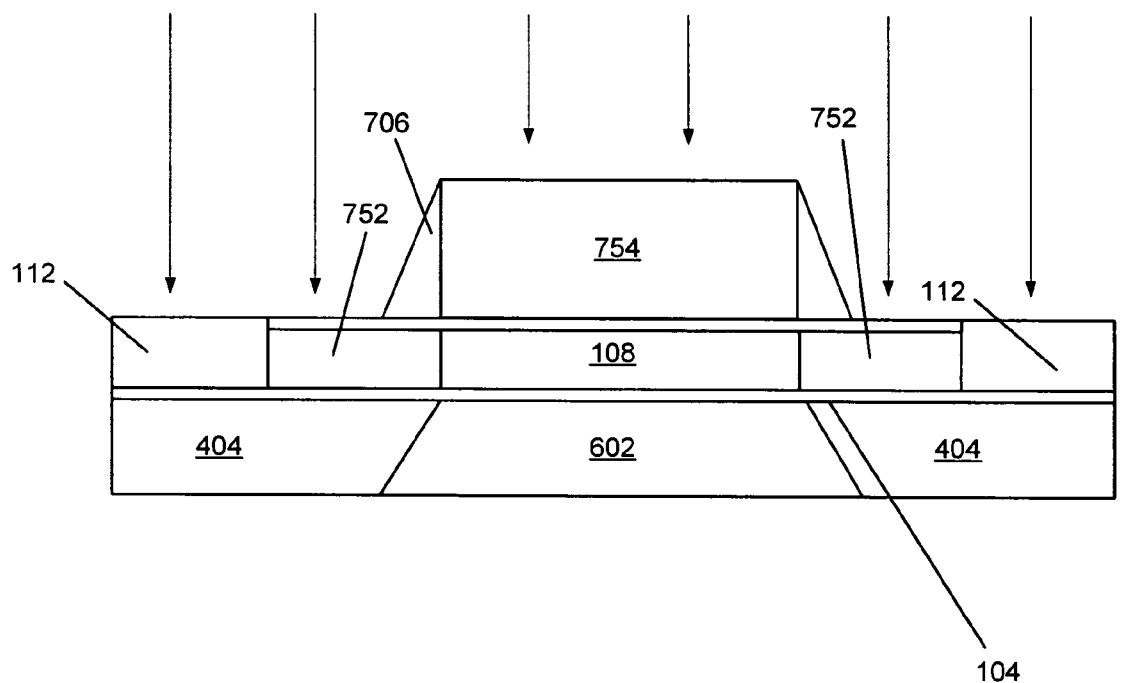
FIG. 7B is diagram not to scale illustrating further exemplary steps for implementing metal-oxide semiconductor (MOS) processing on the enhanced SOI BOX structure of FIG. 7A in accordance with another preferred embodiment.

Referring now to FIG. 7B, there is shown a next exemplary structure generally designated by the reference character 750 where further metal-oxide semiconductor (MOS) processing steps are performed on the enhanced SOI BOX structure 700 of FIG. 7A in accordance with another preferred embodiment. Doping, formation and activation of each respective source/drain region 752 and a gate electrode 754 are provided. Source/drain regions 752 are implemented with appropriate strain for mobility improvement for both PFET and NFET devices such as SiGe epitaxy.

Figure 8:
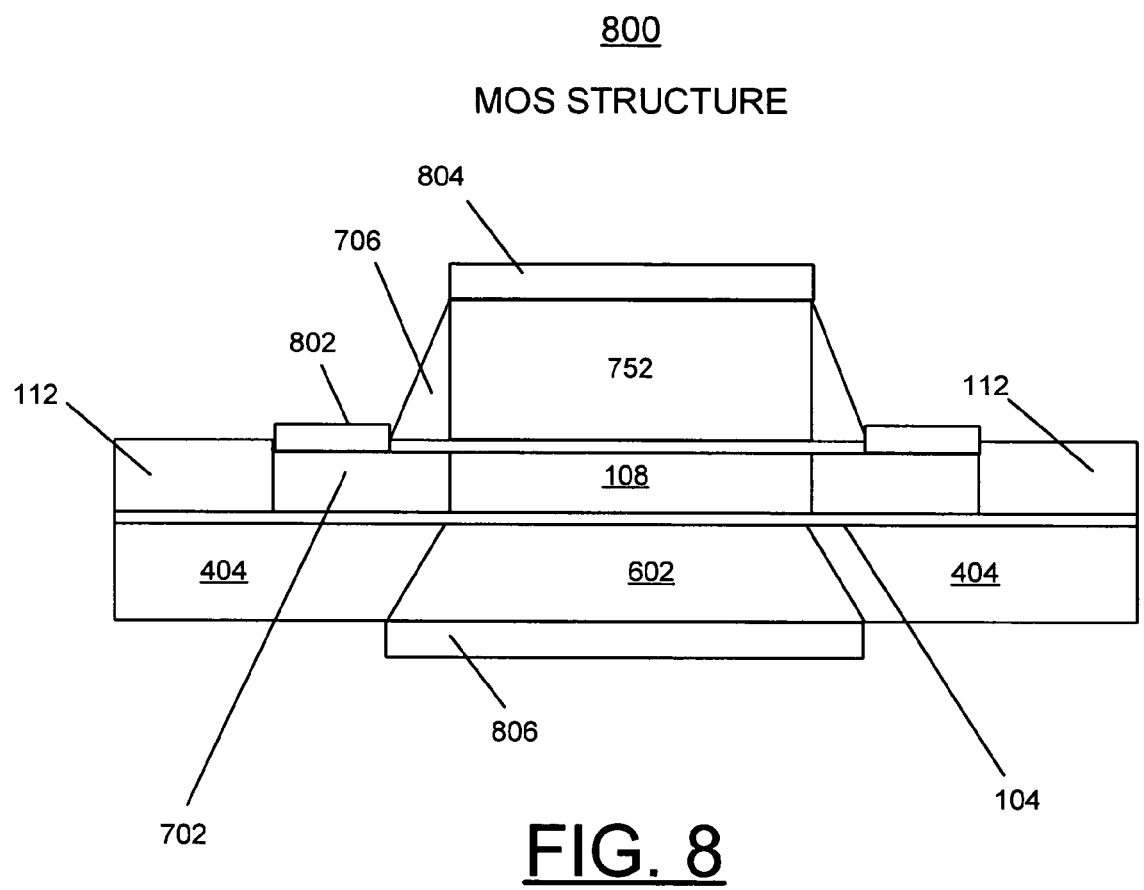
FIG. 8 is a diagram not to scale illustrating further exemplary steps for MOS and backside processing on the enhanced SOI BOX structure of FIG. 7B for implementing an enhanced SOI BOX structure in accordance with another preferred embodiment.

Referring now to FIG. 8, there is shown a next exemplary structure generally designated by the reference character 800 where further MOS and backside processing steps are performed on the enhanced SOI BOX structure 750 of FIG. 7B for implementing an enhanced SOI BOX structure in accordance with another preferred embodiment. A silicide formation 802 on the source and drain regions 702, a silicide formation 804 on the gate 752, and a silicide formation 806 on the doped isolated island region 602 are provided for contact formation.

Referring now to FIGS. 9A, 9B, 10, and 11, there are shown exemplary steps for implementing an enhanced SOI BOX structure forming a novel backside anti-fuse (AF) structure in accordance with another preferred embodiment.

Figure 9A:
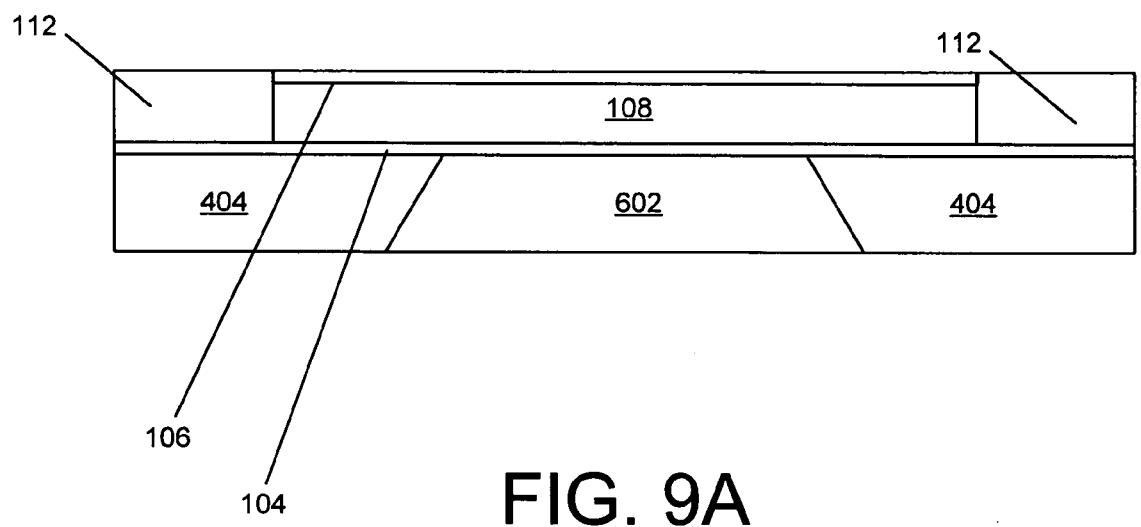
FIGS. 9A, 9B, 10, and 11 are diagrams not to scale illustrating exemplary steps for implementing an enhanced SOI BOX structure forming a novel backside anti-fuse (AF) structure in accordance with another preferred embodiment.

Referring now to FIG. 9A, there is shown an exemplary structure generally designated by the reference character 900 for forming an enhanced SOI anti-fuse (AF) structure of this preferred embodiment. SOI structure 900 results following a backside implant performed to dope the isolated region 602 of FIG. 6 to be used to make a gate or AF structure of this preferred embodiment. In addition, As can be implanted into the backside dielectric 602 to weaken the backside dielectric.

Figure 9B:
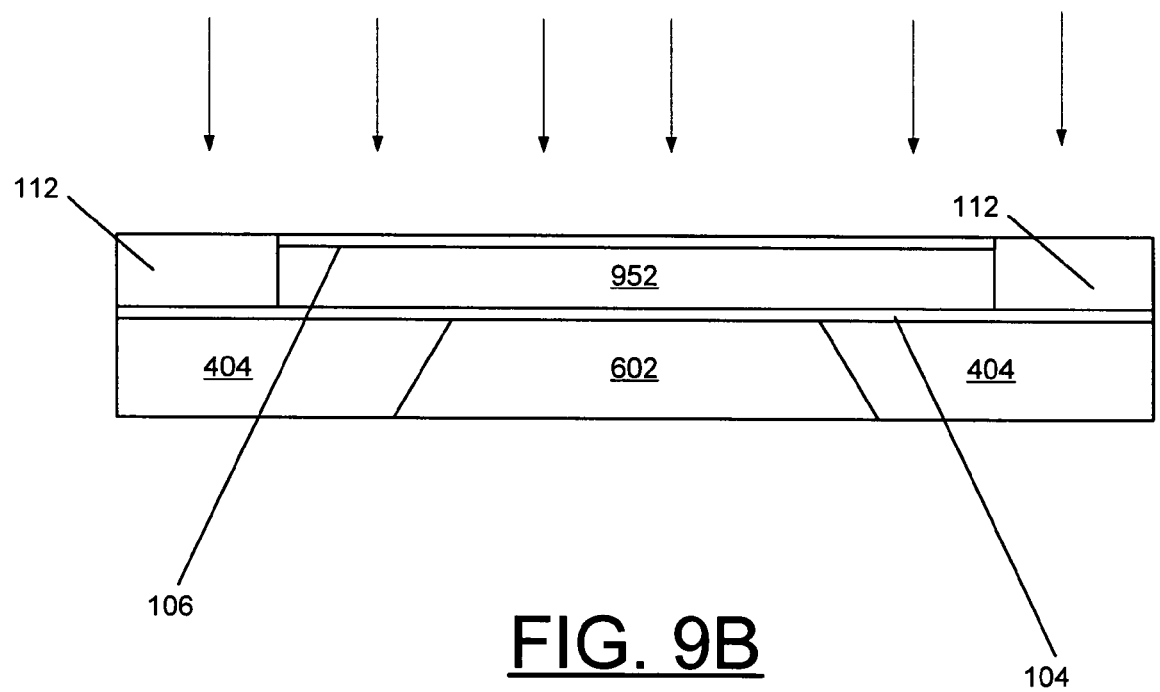

Referring now to FIG. 9B, there is shown a next exemplary structure generally designated by the reference character 950 where a front side implant is preformed to provide a heavily doped plate 952 from the active layer 108 for forming an enhanced SOI anti-fuse (AF) structure of this preferred embodiment.

Figure 10:
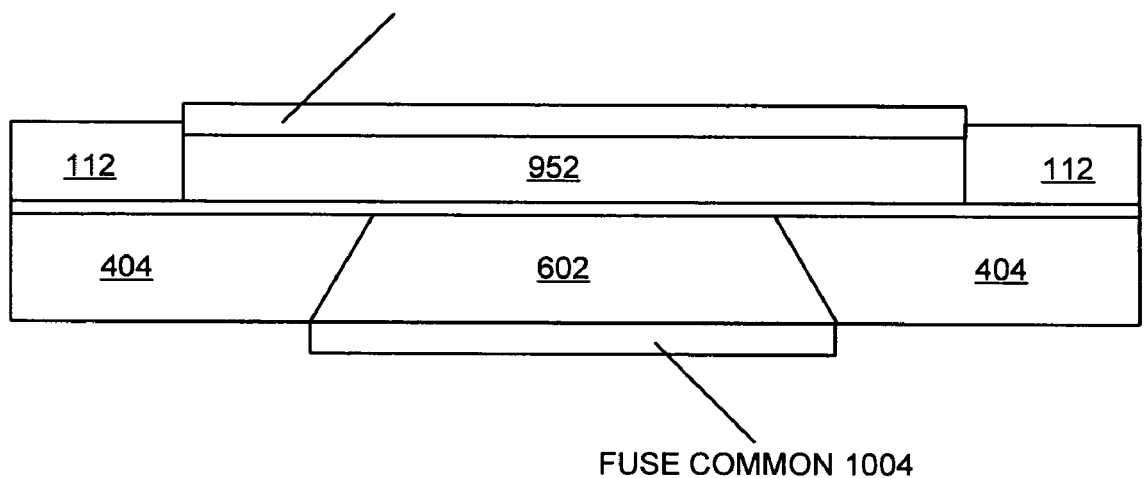

Referring now to FIG. 10, there is shown a next exemplary structure generally designated by the reference character 1000 where a silicide formation forms an individual AF node 1002 on the heavily doped plate 952, and a silicide formation forms a fuse common 1004 on the doped isolated island region or backgate region 602 are provided for contact formation.

Figure 11:
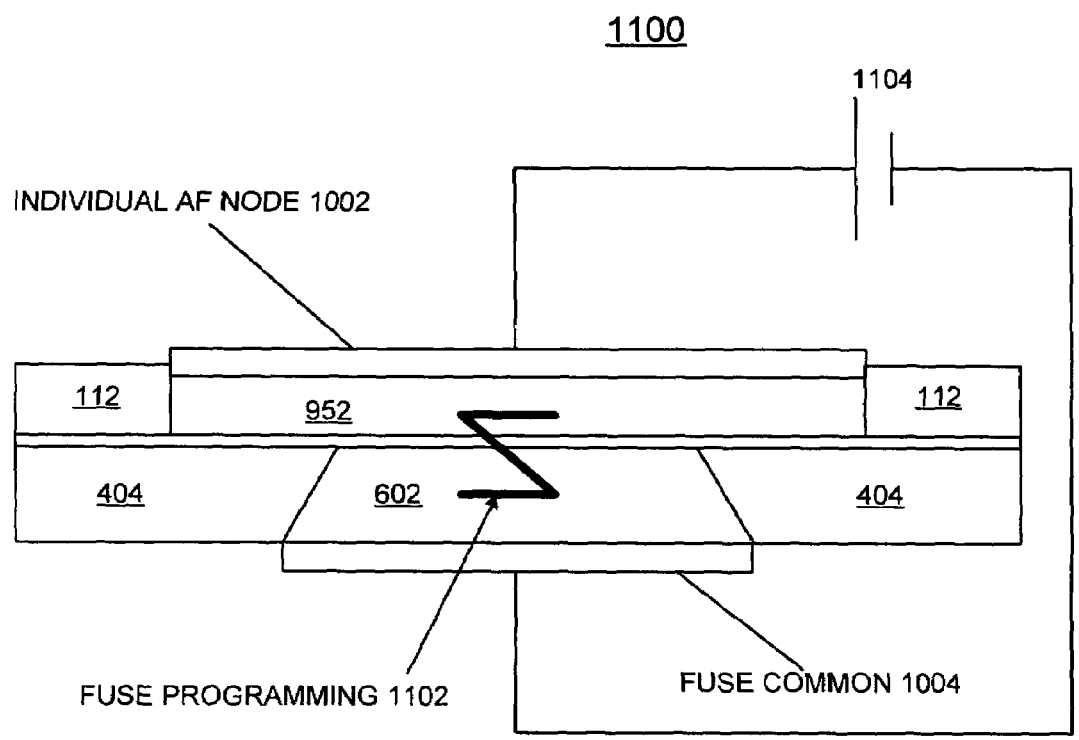

Referring now to FIG. 11, there is shown a next exemplary structure generally designated by the reference character 1100 where a fuse programming step indicated by line 1102 is performed. A voltage supply source 1104 is connected between the individual AF node 1002 on the heavily doped plate 952, and the fuse common 1004 on the doped isolated island region 602 to provide the fuse programming 1102 connection between the heavily doped plate 952 and the doped isolated island region 602.

Referring now to FIGS. 12, 13, 14, and 15 are diagrams not to scale illustrating exemplary steps for implementing an enhanced SOI BOX structure for another novel backgate fuse structure for providing a programmable body contact in accordance with another preferred embodiment.

Figure 12:
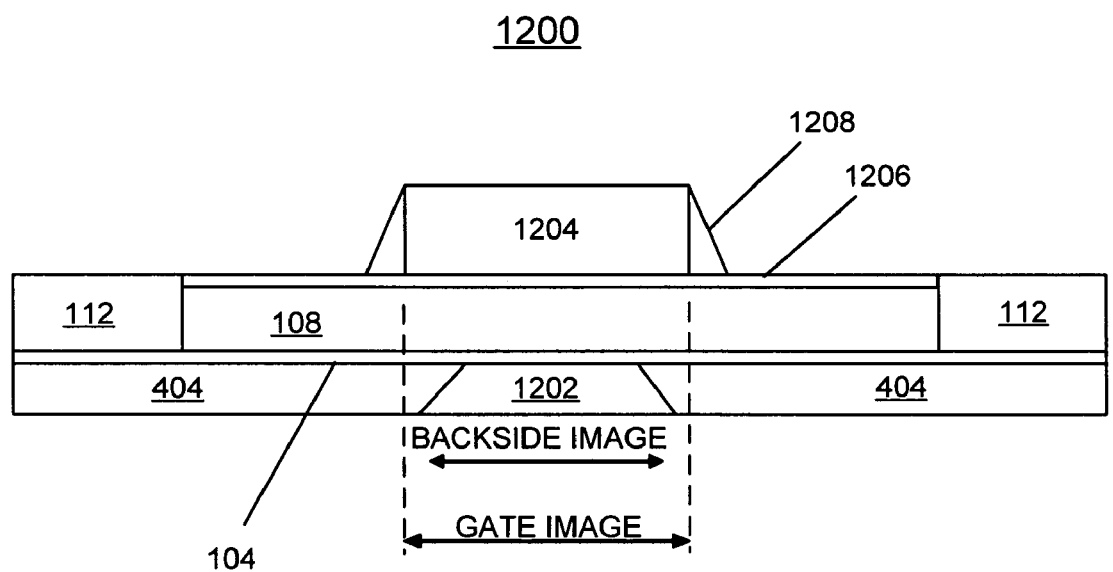
FIGS. 12, 13, 14, and 15 are diagrams not to scale illustrating exemplary steps for implementing an enhanced SOI BOX structure for another novel backgate fuse structure for providing a programmable body contact in accordance with another preferred embodiment.

Referring now to FIG. 12, there is shown an exemplary structure generally designated by the reference character 1200 for forming an enhanced SOI backgate structure to provide a programmable body contact of this preferred embodiment. SOI structure 1200 results following an anneal step of FIG. 4B. A backgate 1202 of the enhanced SOI backgate structure of this preferred embodiment is formed that is smaller than a front gate or a gate electrode 1204 so that alignment problems are avoided. As indicated by an arrow labeled GATE IMAGE, the gate electrode 1204 or gate image is larger than the backgate 1202, as indicated by an arrow labeled BACKSIDE IMAGE. This size differential enables aligning the larger front gate electrode 1204 with the backgate 1202 without alignment problems.

As shown in FIG. 12, a gate oxide layer 1206 and the gate electrode 1204 are grown. The gate electrode 1204, such as polysilicon gate electrode has, for example, a thickness range 10 nm to 100 nm. As shown, a pair of spacers 1208 optionally is formed on the sidewalls of the gate electrode 1204.

Figure 13:
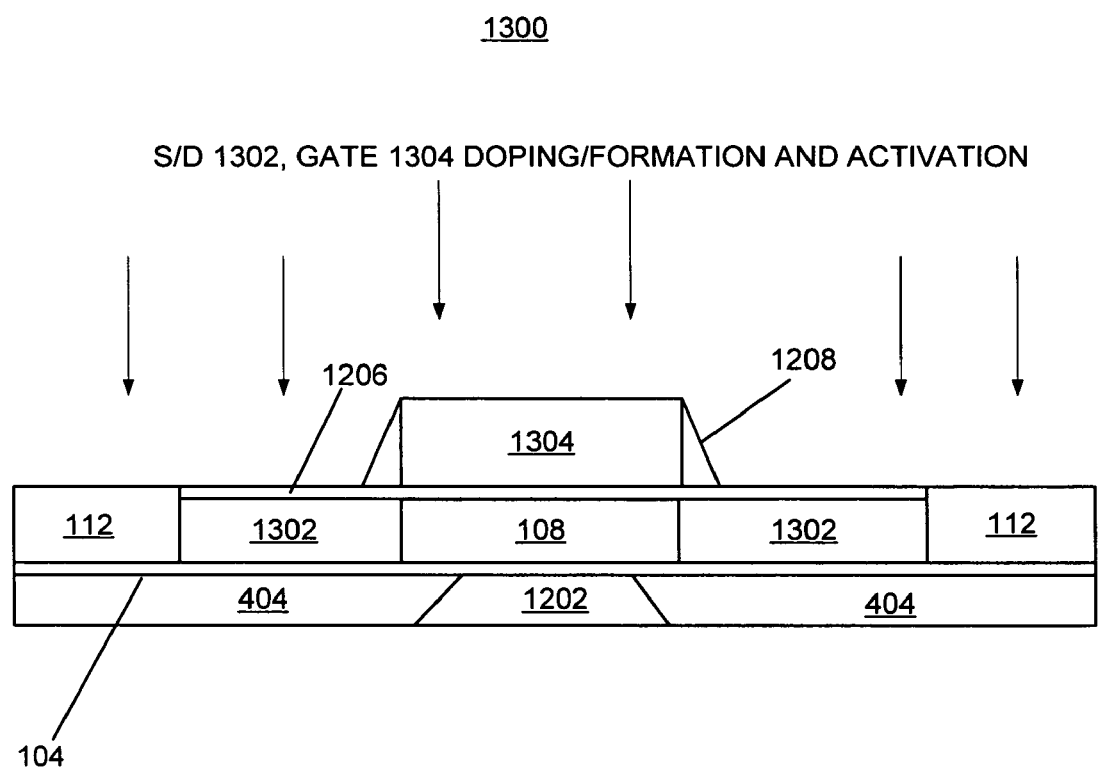

Referring now to FIG. 13, there is shown a next exemplary structure generally designated by the reference character 1300 where doping, formation and activation of each respective source/drain region 1302 and a gate electrode 1304 are provided. Source/drain regions 1302 are implemented with appropriate strain for mobility improvement for both PFET and NFET devices.

Figure 14:
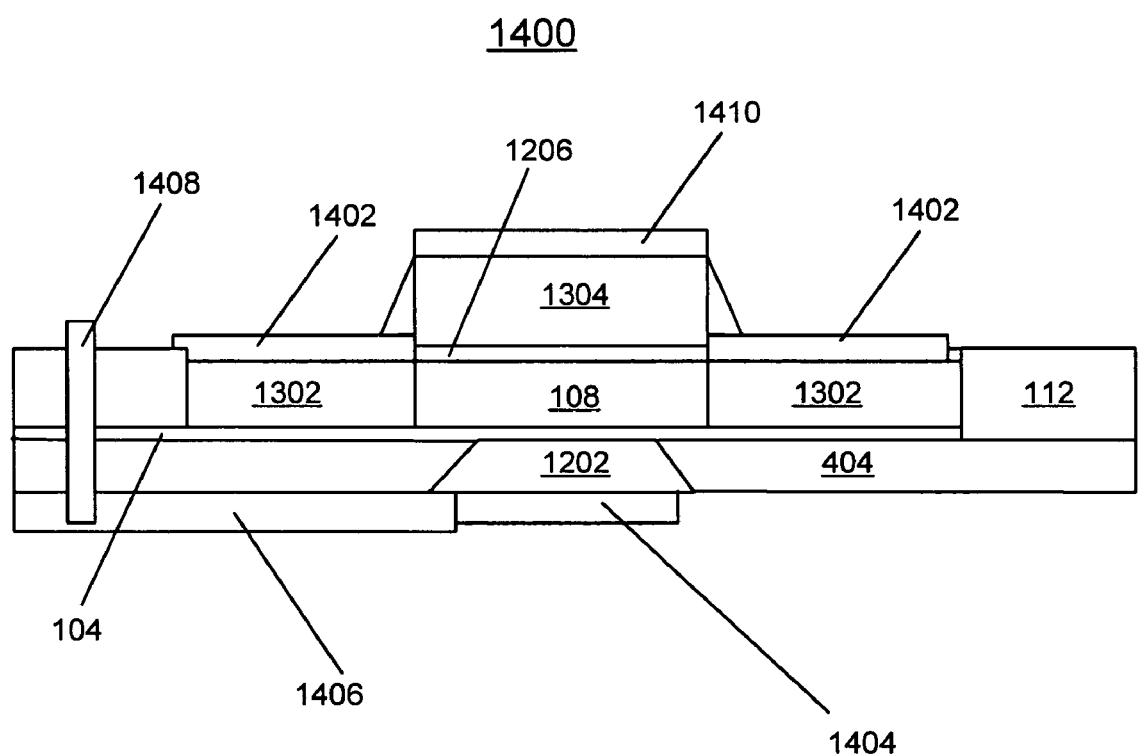

Referring now to FIG. 14, there is shown a next exemplary structure generally designated by the reference character 1400 where a silicide formation 1402 is provided on each respective source/drain region 1302 and a silicide formation 1404 is provided on the backgate 1202. A backside metal 1406 is connected to the silicide formation 1402 and the backgate 1202, extending under the thick BOX region 404 and is connected to a stud contact 1408. The stud contact 1408 extends from the backside metal 1406 through the thick and thin BOX layers 404 and 104, and STI region 112 enabling connection to the stud contact 1408 above the STI region 112. Also a silicide formation 1410 on the gate electrode 1304 is provided.

Figure 15:
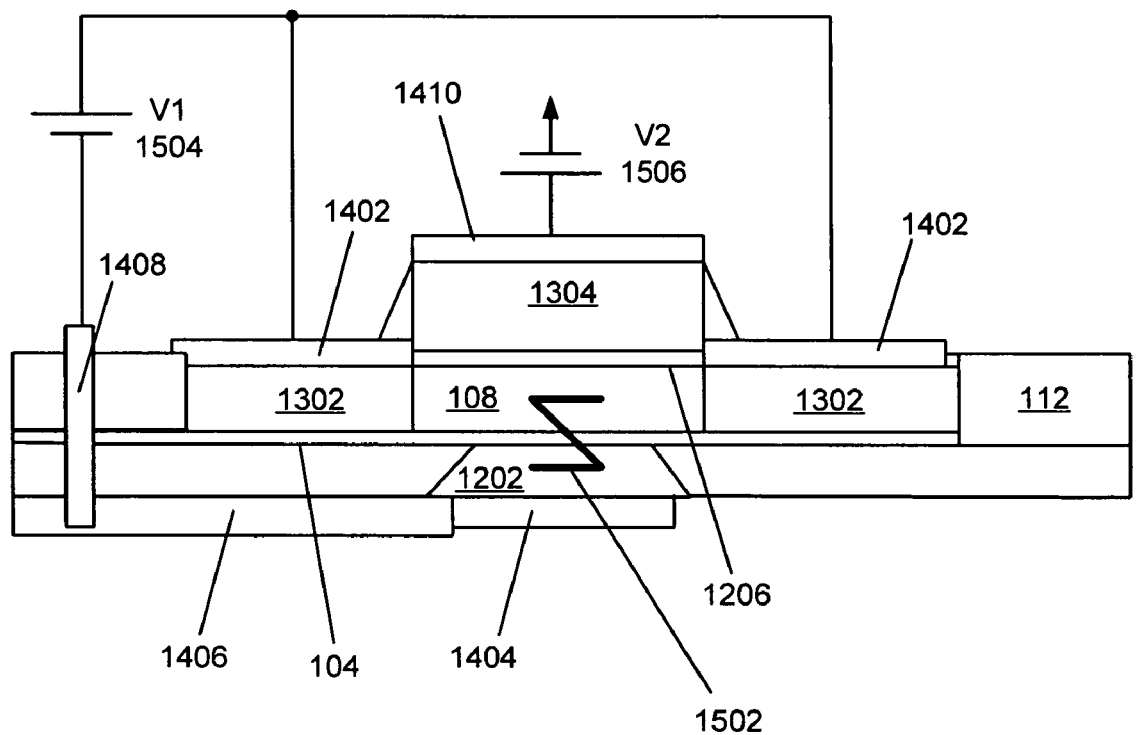

Referring now to FIG. 15, there is shown a next exemplary structure generally designated by the reference character 1500 where a programmable body contact 1502 is provided. A first voltage supply source V1, 1504 is connected between the backgate 1202 via the stud contact 1408 and the backside metal 1406 and the source/drain regions 1302 via the silicide formation 1402. A second voltage supply source V2, 1506 is connected between the front gate electrode 1304 and ground. Body tie programming indicated by programmable body contact 1502 creating a resistive path between the active layer or channel body 108 and the backgate 1202 is provided by a voltage bias with the potential of the first voltage supply source V1, 1504 greater than the potential of the second voltage supply source V2, 1506.

As shown in FIG. 15, the source and drain regions 1302 are wired as one of the fuse terminals and the backgate or buried gate 1202 is the other terminal. To read the programmable body contact or fuse 1502, the buried gate 1202 is raised to a potential such that the back channel 108 is in inversion and the leakage current between the buried gate 1202 and source/drain 1302 is measured. To blow the fuse 1502, the potential of the buried gate 1202 is raised to a higher potential that causes enough oxide damage to change the buried gate leakage current. Sensing the current before and after the fuse blow is used to detect a change in fuse state, optionally using an unblown device 1502 for a current reference.

Qualitative analysis or simulation has been performed for a method for operating the device 1502, where the body contact of the SOI transistor and the gate are used to set the electric field across the back oxide in order to create oxide damage or breakdown. What this simulation shows is that for moderate well/halo doses and 90 nm type oxides (~1 nm) and potentials, for example, 1.1V across the oxide, sufficient field strength was achieved for causing oxide breakdown, such as electric field strength in excess of 10 MV/cm. Also the back oxide could be made intrinsically weaker by design to assist in this process.

Referring now to FIGS. 16, 17, 18, and 19, there are shown exemplary steps for implementing self-aligned oxygen implants through a top or front side of an SOI structure in accordance with another preferred embodiment where preferential Si island strain for both NF and PF device mobility enhancement and simultaneous thin and thick BOX regions are provided for minimized junction capacitance, and improved backgate coupling.

Figure 16:
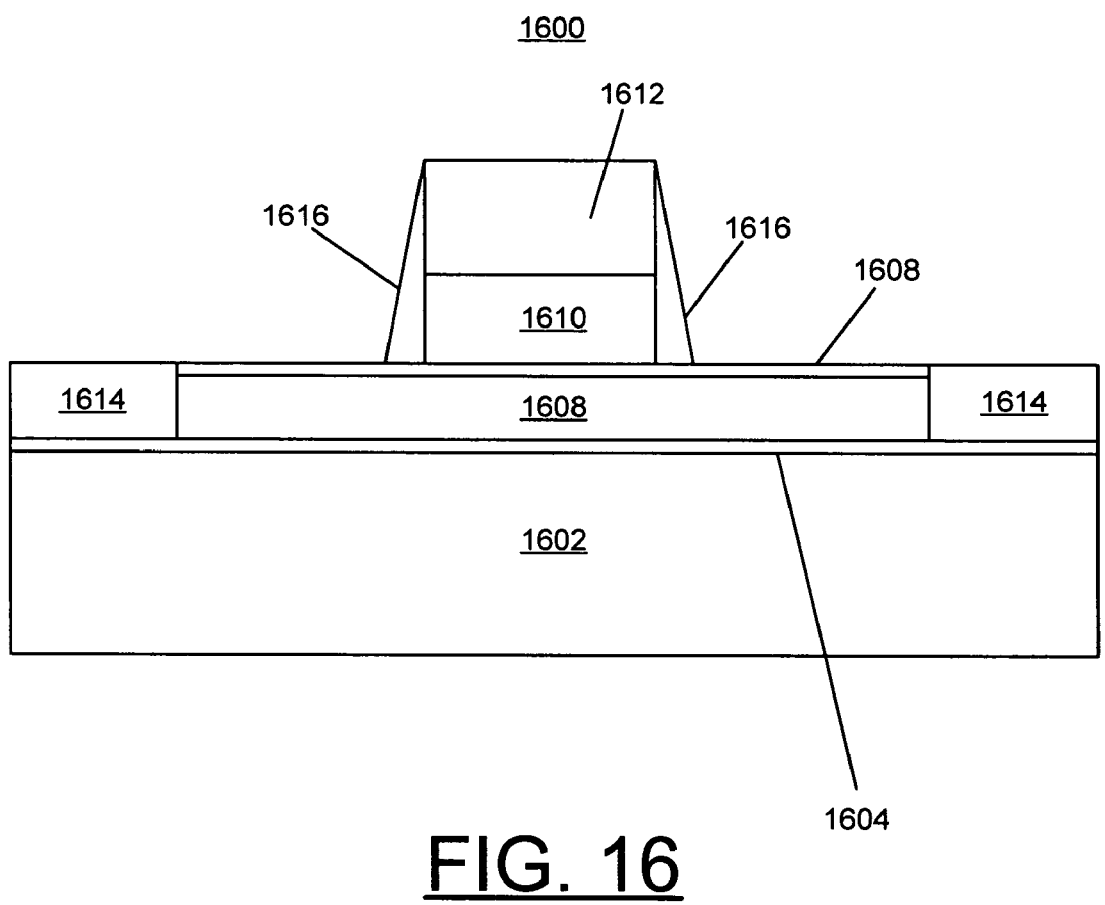
FIGS. 16, 17, 18, and 19 are diagrams not to scale illustrating exemplary steps for implementing self-aligned oxygen implants through a top or front side of an SOI structure in accordance with another preferred embodiment.

Referring now to FIG. 16, there is shown an exemplary structure generally designated by the reference character 1600 for forming enhanced SOI transistors of this embodiment. Structure 1600 includes a substrate 1602, such as a silicon substrate 1602, a very thin buried oxide (BOX) layer 1604, such as an oxynitride layer, of thickness range 2 nm to 10 nm, a gate insulation layer or gate dielectric 1606 of EOT (electrically Equivalent Oxide Thickness) of 0.9 nm to 2 nm, an active layer or silicon layer 1608 of thickness range 5 nm to 750 nm, and a gate electrode 1610, such as polysilicon or a metal gate electrode 1610 of thickness range 10 nm to 100 nm. A protective cap layer 1612, such as a silicon nitride $Si_3N_4$ cap 1612 of thickness range 50 nm to 100 nm is formed above the gate electrode 1610 of thickness range 13 nm to 30 nm preferably 18 nm, for example, that was etched in-situ. Shallow trench isolation (STI) region 1614 is formed over the thin BOX layer 1604. STI region 1614 is continuous around the active device region. A respective spacer 1616 is formed on the sidewalls of the gate electrode 1610 and the protective cap 1612. As shown, the gate stack contains the self aligned disposable cap 1612 and disposable spacer 1616 to protect the gate electrode 1610 from damage. It is assumed in this embodiment the active Si layer 1608 is thin so that resultant damage in the silicon area is not a concern. The gate cap 1612 can be used to protect the gate electrode material 1610 from dopant introduction, or silicon deposition, during the subsequent formation of source and drain junction regions by ion implanation and selective SiGe epixaxy (not shown).

Figure 17:
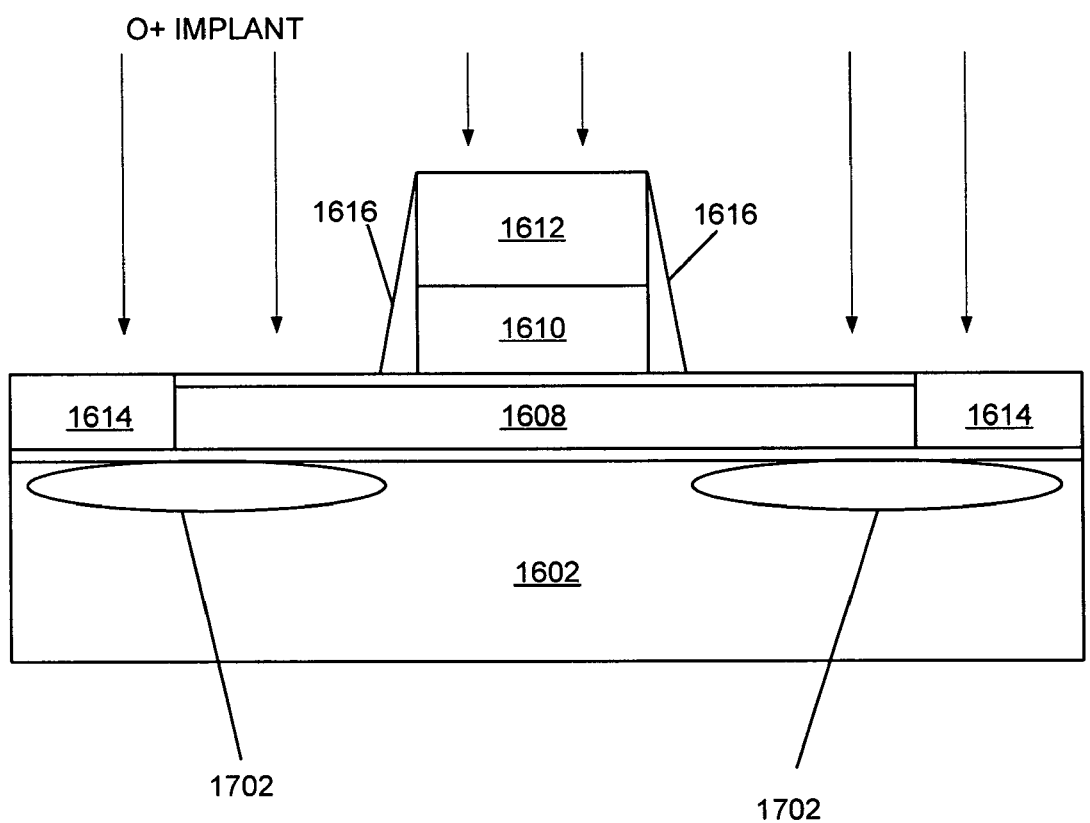

Referring now to FIG. 17, there is shown a next exemplary structure generally designated by the reference character 1700 where an oxygen implant step is performed as indicated by arrows O+ implant. The O+ implant is self-aligned to the gate electrode structure 1612. A plurality of self aligned oxygen implants 1702 is used to form thick box regions under MOS diffusions. The oxygen implant step through the seed layer is provided, for example, at an energy level in a range from 20 to 200 KeV using a dose of in the range of 1016 $cm^{-2}$ to $5 \times 10^{18}$ $cm^{-2}$.

Figure 18:
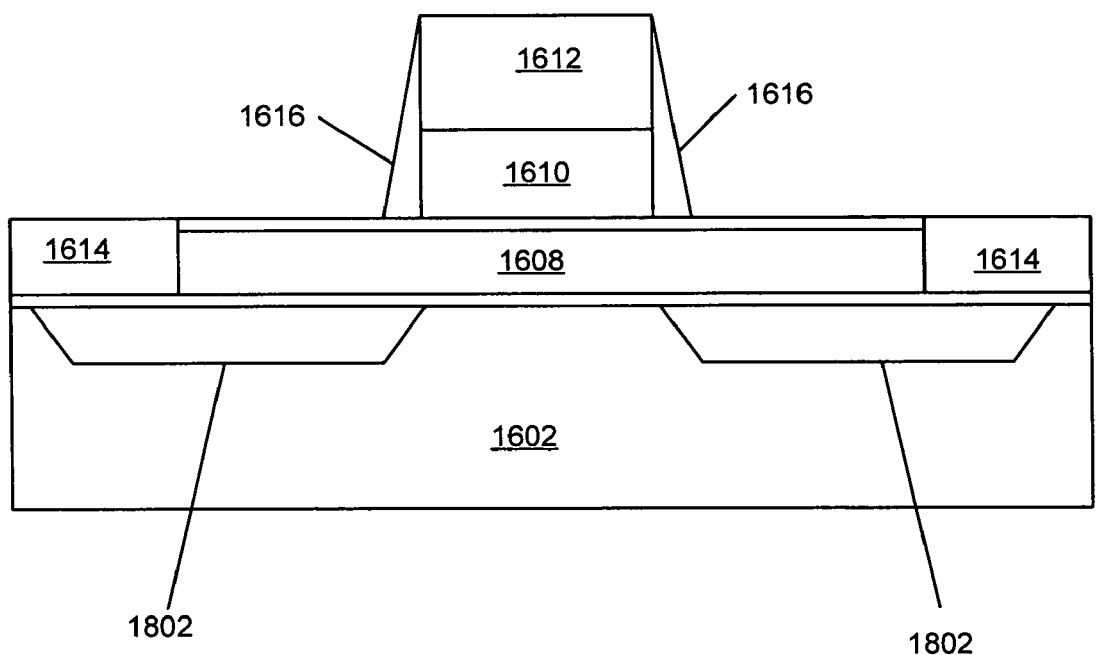

Referring now to FIG. 18, there is shown a next exemplary structure generally designated by the reference character 1800 where an anneal process is performed to convert the oxygen implants 1702 to respective thick box region 1802 at a temperature between 600° C. to 1350° C., preferably in a temperature range between 900° C. and 1100° C., for a period of several minutes to 10 hours in an inert ambient.

Figure 19:
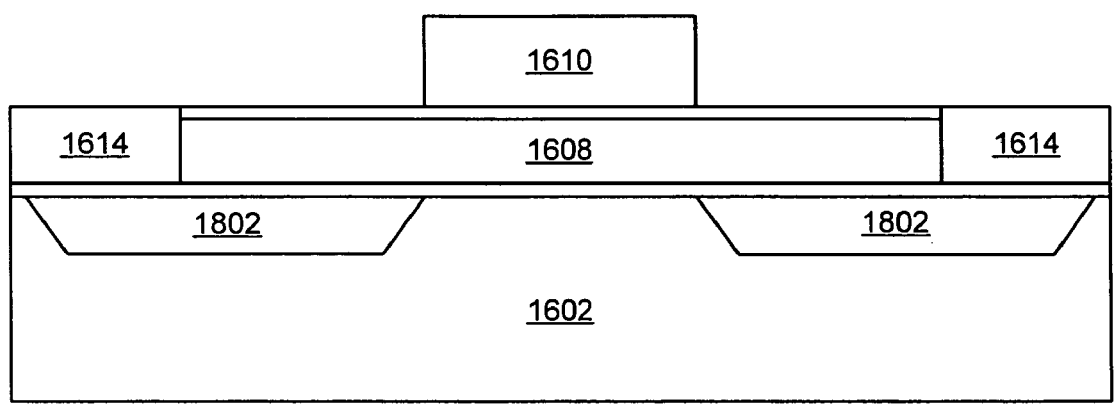

Referring now to FIG. 19, there is shown a next exemplary structure generally designated by the reference character 1900 where in a next process strip nitride step, the nitride cap 1612, and the $Si_3N_4$ spacers 1616 are removed. Subsequent to these steps selected backgate processing steps are performed as described above with respect to the other embodiments. Also conventional front-end-of-line (FEOL) processing steps can be used to complete a transistor device. These steps can include but are not limited to source/drain implants, extension implants, silicide formation on the gate, source, and drain, and contact formation (not shown).

While the present invention has been described with reference to the details of the embodiments of the invention shown in the drawing, these details are not intended to limit the scope of the invention as claimed in the appended claims.

What is claimed is:

1. A method for implementing enhanced silicon-on-insulator (SOI) buried oxide (BOX) structures comprising the steps of:
   providing a thin buried oxide (BOX) layer under a device channel in a silicon substrate layer and a pad oxide layer carried by the active layer;
   thinning the silicon substrate layer;
   performing an oxygen implant step from the backside into the thinned silicon substrate layer; and
   forming thick buried oxide (BOX) regions from oxygen implants in the silicon substrate layer.

2. A method for implementing enhanced silicon-on-insulator (SOI) buried oxide (BOX) structures as recited in claim 1 wherein the oxygen implant step forms an isolated region near the oxygen implants.

3. A method for implementing enhanced silicon-on-insulator (SOI) buried oxide (BOX) structures as recited in claim 2 includes a backside implant step for selectively doping the isolated region to form a backgate for an SOI device being formed, the SOI device being formed including a selected one of anti-fuse (AF) devices, and SOI transistors including PFET and NFET devices.

4. A method for implementing enhanced silicon-on-insulator (SOI) buried oxide (BOX) structures as recited in claim 3 includes forming a gate oxide and a gate electrode over the active region above the backgate.

5. A method for implementing enhanced silicon-on-insulator (SOI) buried oxide (BOX) structures as recited in claim 4 includes doping each respective source/drain region and the gate electrode for forming the SOI transistor.

6. A method for implementing enhanced silicon-on-insulator (SOI) buried oxide (BOX) structures as recited in claim 1 includes forming a gate oxide and a gate electrode over the active region above the backgate, said gate electrode having an image larger than a backgate image.

7. A method for implementing enhanced silicon-on-insulator (SOI) buried oxide (BOX) structures as recited in claim 6 includes doping each respective source/drain region and the gate electrode for forming the SOI transistor.

8. A method for implementing enhanced silicon-on-insulator (SOI) buried oxide (BOX) structures as recited in claim 7 includes forming a programmable body contact by applying a first voltage supply potential between the source/drain regions and the backgate and applying a second voltage supply potential between the gate electrode and ground, where the first voltage supply potential is greater than the second voltage supply potential.

9. A method for implementing enhanced silicon-on-insulator (SOI) buried oxide (BOX) structures as recited in claim 3 includes providing a doping implant into the active layer above the backgate to form a doped plate region from the active layer.

10. A method for implementing enhanced silicon-on-insulator (SOI) buried oxide (BOX) structures as recited in claim 9 includes forming a respective contact on the backgate and doped plate region to form respective anti-fuse (AF) connections.

11. A method for implementing enhanced silicon-on-insulator (SOI) buried oxide (BOX) structures as recited in claim 10 includes applying a voltage potential between the respective anti-fuse (AF) connections in a fuse programming step forming a conduction path between the backgate and doped plate region.

* * * * *